United States Patent
Nagasaka et al.

(10) Patent No.: US 6,798,495 B2
(45) Date of Patent: Sep. 28, 2004

(54) EXPOSURE APPARATUS, EXPOSURE METHOD AND DEVICE PRODUCTION METHOD

(75) Inventors: Hiroyuki Nagasaka, Kumagaya (JP); Naomasa Shiraishi, Saitama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/389,816

(22) Filed: Mar. 18, 2003

(65) Prior Publication Data

US 2003/0156268 A1 Aug. 21, 2003

Related U.S. Application Data

(63) Continuation of application No. PCT/JP01/07994, filed on Sep. 14, 2001.

(30) Foreign Application Priority Data

Sep. 19, 2000 (JP) ......................................... 2000-282980

(51) Int. Cl.[7] ........................ G03B 27/54; G03B 27/72; G03B 27/74
(52) U.S. Cl. .............................. 355/67; 355/68; 355/69
(58) Field of Search ............................. 355/53, 67, 68, 355/69

(56) References Cited

U.S. PATENT DOCUMENTS

| | | | |
|---|---|---|---|
| 5,906,429 A | 5/1999 | Mori et al. | 362/293 |
| 6,108,126 A | 8/2000 | Hagiwara et al. | 359/361 |
| 6,204,911 B1 * | 3/2001 | Kurosawa et al. | 355/53 |
| 6,337,734 B1 * | 1/2002 | Mori | 355/69 |
| 6,621,558 B1 * | 9/2003 | Takahashi | 355/69 |
| 2002/0075933 A1 * | 6/2002 | Stamm et al. | 372/57 |
| 2002/0118721 A1 | 8/2002 | Bittenson | 372/100 |

FOREIGN PATENT DOCUMENTS

| | | |
|---|---|---|
| JP | A 5-190425 | 7/1993 |
| JP | A 2001-284227 | 10/2001 |

* cited by examiner

Primary Examiner—Rodney Fuller
(74) Attorney, Agent, or Firm—Oliff & Berridge PLC

(57) ABSTRACT

An exposure apparatus comprising a light source which emits a light including a main light having a wavelength to expose a substrate and sub light having a different wavelength from that of the main light collaterally generated in accordance with an oscillation of the main light, a main optical system which introduces a light from the light source to the substrate via the mask, a light sensor having sensitivity to a wavelength including the main light, and a separation device disposed an a light path from the light source to the light sensor, the separation device separating the main light and the sub light.

20 Claims, 8 Drawing Sheets

US 6,798,495 B2

EXPOSURE APPARATUS, EXPOSURE METHOD AND DEVICE PRODUCTION METHOD

This application is a continuation of PCT/JP01/07994 filed Sep. 14, 2001.

BACKGROUND OF THE INVENTION

1. Field of the Invention

The present invention relate to an exposure apparatus and an exposure method used in a photolithography process for producing a semiconductor device, a liquid crystal display, an image pickup device, a thin film magnetic head and other micro device and a method of producing devices using the method.

2. Description of the Related Art

When producing a micro device, such as a semiconductor device, liquid crystal display, image pickup device (CCD, etc.), thin film magnetic head, etc. by using a photolithography technique, an exposure apparatus for performing projection exposure of an image of a reticle pattern as a mask on a wafer (or a glass plate, etc.) being coated a photo resist, etc. via a projection optical system is used.

In such an exposure apparatus, a wavelength of an exposure light has ben made shorter to improve resolution of a pattern to be formed on a wafer along with micro devices becoming minute. Due to this, the exposure light to be used has shifted from a g-ray (a wavelength of 436 nm) and an i-ray (a wavelength of 365 nm) by a high-pressure mercury lamp to a KrF excimer laser (a wavelength of 248 nm) and an ArF excimer laser (a wavelength of 193 nm). Also, to deal with further higher resolution, use of an $F_2$ laser (a wavelength of 157 nm) has been recently studied.

A light oscillated from the $F_2$ laser is so-called a vacuum ultraviolet ray, which is almost incapable of transmitting in the air because it is absorbed by substances, such as oxygen, water or organic materials. Thus, when it is used as an exposure light, it is necessary that a light path thereof is made vacuum or filled with an inert gas, such as helium (He), neon (Ne), argon (Ar), krypton (Kr), and other inert gases and nitrogen ($N_2$), which allows a light having a wavelength of about 157 nm pass through it.

Also, in the above exposure apparatus, a variety of light sensors (photodetectors) are permanently provided for monitoring whether exposure amount control for keeping an exposure amount (cumulative exposure energy) in a suitable range for every spot in respective shot regions of a wafer and an exposure light (exposure region) keeps a suitable condition without illuminance unevenness, and monitoring whether the light path in kept under a suitable environment for the exposure light to transmit, etc. and energy (illuminance, an amount of light, intensity, etc.) of the exposure light is measured. As a light sensor for such measurement, a silicon photodiode, pyroelectric or thermal actinometer is often used in terms of performance and costs.

Here, when adopting the above $F_2$ laser as a light source, the $F_2$ laser exhibits a characteristic of oscillating a vacuum ultraviolet ray (hereinafter, also referred to as a main light) having a wavelength of 157 nm and collaterally generating a red light (hereinafter, also referred to as a sub light) having a wavelength of 630 to 720 nm or so, which does not contributes to exposure. Intensity of the sub light is about 5 to 10% of the total immediately after emitted from the $F_2$ laser. The sub light exhibits almost no attenuation due to an optional system composing the light path of the exposure light, so it reaches to a light sensor along with the main light.

While, a silicon photodiode and a pyroelectric or thermal actinometer as above used as a light sensor are sensitive not only to the wavelength of the main light but to that of the sub light, so they also detect the sub light and cannot accurately measure a light amount of the main light which contributes to exposure. Thus, there in a disadvantage that exposure amount control is not suitably performed and a highly fine pattern cannot be formed in some cases.

Further, when monitoring entering of the air to the light path and generation of impurities by using a result detected by a light sensor, since attenuation of the main light in much while that of the sub light is little and detected by the light sensor, processing may be continued by judging that there is no problem even in the case here actually the operation has to be halted due to an error, which in a crucial matter.

SUMMARY OF THE INVENTION

An object of the present invention is to enable accurate measurement of energy of a main light, exposure amount control and other failure monitoring, etc. at high accuracy even in the case of using a light source which also generates collaterally an unnecessary sub light long with an oscillation of a main light having a wavelength to expose a substrate.

According to a first aspect of the present invention, there is provided an exposure apparatus which exposes a substrate via a mask being formed a pattern, comprising a light source which emits a light including a main light having a wavelength to expose the substrate and a sub light having a different wavelength from that of the main light collaterally generated in accordance with an oscillation of the main light; a main optical system which introduces a light from the light source to the substrate via the mask; a light sensor having sensitivity to a wavelength including at least the main light; and a separation device disposed on a light path from the light source to the light sensor, which separates the main light and the sub light.

According to the present invention, as a result that the separation device which separates the main light and the sub light is disposed on th light path from the light source to the light sensor, only the main light can incident on the light sensor and a detection error caused by also detecting the sub light can be reduced.

When the above exposure apparatus is provided with a branch optical system which introduces a part of the light from the main optical system to the light sensor, the separation device can be provided between the branch optical system and the light sensor. Due to the provision of the separation device inside the branch optical system which introduces the light to the light sensor, attenuation of the light passing the main optical system caused by the separation device can be eliminated.

The exposure apparatus may be further comprised with a control device which controls a cumulative light amount on the substrate based on the main light separated by the separation device. The control device is capable of controlling the cumulative light amount based on a measurement result only of the main light by the light sensor, so an effect of the sub light can be excluded and accurate control can be performed.

In the exposure apparatus, a shift device which selectively shifts the separation device between a first position of being out of a light path of the light branched by the branch optical system and a second position placed on the light path can be provided. In this case, a correction device which corrects a measurement result by the light sensor when the separation device is shifted to the first position based on a measurement result by the light sensor when the separation device is shifted to the second position can be further provided.

When measuring by the light sensor by setting the separation device at the first position (position out of the light path), a light not separated to the main light and the sub light irradiates on the light sensor. On the other hand, when measuring by the light sensor by setting the separation device at the second position (position on the light path), only the sub light can irradiate on the light sensor. As a result, an accurate measurement result of the main light excluding the sub light can be obtained from measurement results of both.

As the separation device, an optical filter which transmits a light of a wavelength range including a wavelength of the main light and attenuates a light of a wavelength range including a wavelength of the sub light, or a reflective transmissive type mirror (dichroic mirror) which reflects the light of the wavelength range including the wavelength of the main light and allows the light of the wavelength range including the wavelength of the sub light pass through it can be adopted. Here, the word "attenuates" includes a completely light-blocking case and a case of not completely blocking but transmitting a part thereof (for example, a came where the transmission amount is not more than minimum detection sensitivity of the light sensor).

The present invention is particularly preferable when using an $F_2$ laser light source as the above light source. Namely, the $F_2$ laser light source oscillates an a main light a light of 157 nm while also generates a red light (a wavelength of 630 to 720 nm or so) as a sub light, but it is possible to accurately measure only the main light excluding the red light in this case. As a result, control of a cumulative exposure light amount can be suitably performed and accuracy of a variety of failure monitoring can be improved.

According to a second aspect of the present invention, there in provided an exposure apparatus which exposes a substrate via a mask being formed a pattern, comprising a light source which emits a light including a main light having a wavelength to expose the substrate and a sub light having a different wavelength from that of the main light collaterally generated in accordance with an oscillation of the main light; a main optical system which introduces a light from the light source to the substrate via the mask; a first light sensor having sensitivity to a wavelength range including wavelengths of the main light and the sub light; a second light sensor having sensitivity to a wavelength range including at least a wavelength of the sub light; a first branch optical system disposed on a light path from the light in the main optical system, which introduces a part of the light to the first light sensor; a second optical system disposed on a light path of the light in the main optical system or in the first branch optical system, which introduces a part of the light to the second light sensor; and a separation device disposed between the second branch optical system and the second light sensor, which separates the main light and the sub light. In this case, a correction device which corrects a result measured by the first light sensor based on a result measured by the second light sensor can be further provided. The second light sensor nay be sensitive to the main light.

The light not separated to the main light and the sub light irradiates on the first light sensor. On the other hand, only the sub light can irradiate on the second light sensor. Accordingly, by correcting a measurement result by the first light sensor based on the measurement result by the second light sensor, an accurate measurement result of the main light excluding the sub light can be obtained.

According to a third aspect of the present invention, there in provided an exposure method for exposing a substrate by using an exposure light including a main light having a wavelength to expose the substrate and a sub light having a different wavelength from that of the main light via a mask being formed a pattern, including the steps of separating the sub light from the exposure light including the main light and the sub light; measuring energy (a light amount, intensity, illuminance, etc.) of the exposure light after the separation; and controlling a cumulative exposure light amount on the substrate based on the measurement result.

According to a fourth aspect of the present invention, there is provided an exposure method for exposing a substrate by using an exposure light including a main light having a wavelength to expose the substrate and a sub light having a different wavelength from that of the main light via a mask being formed a pattern, including the steps of branching a part of the exposure light including the main light and the sub light; separating the sub light from the branched exposure light; measuring energy of the exposure light after the separation; and controlling a cumulative exposure light amount on the substrate based on the measurement result.

According to a fifth aspect of the present invention, there is provided an exposure method for exposing a substrate using an exposure light including a main light having a wavelength to expose the substrate and a sub light having a different wavelength from that of the main light via a mask being formed a pattern, including the steps of measuring first energy of the exposure light including the main light and the sub light; separating the main light from the exposure light including the main light and the sub light; measuring second energy of the exposure light after separating the main light; and correcting the first energy based on the second energy and controlling a cumulative exposure light amount on the substrate based on the corrected first energy.

According to the exposure method according to the above third to fifth aspects of the present invention, the main light excluding the sub light can be measured accurately. These methods are particularly preferable when the light including the main light and the sub light is a laser emitted from the $F_2$ laser light source.

According to a sixth aspect of the present invention, there is provided a method of producing a device including a step of transferring an image of the mask pattern to the substrate by using the exposure method according to the above third to fifth aspect of the present invention.

BRIEF DESCRIPTION OF THE DRAWINGS

These and other objects and features of the present invention will be come clearer from the following description of the preferred a given with reference to the attached drawings, in which.

DESCRIPTION OF THE PREFERRED EMBODIMENTS

Below, embodiments of the present invention will be explained with reference to drawings.

Overall Configuration

Figure 1:
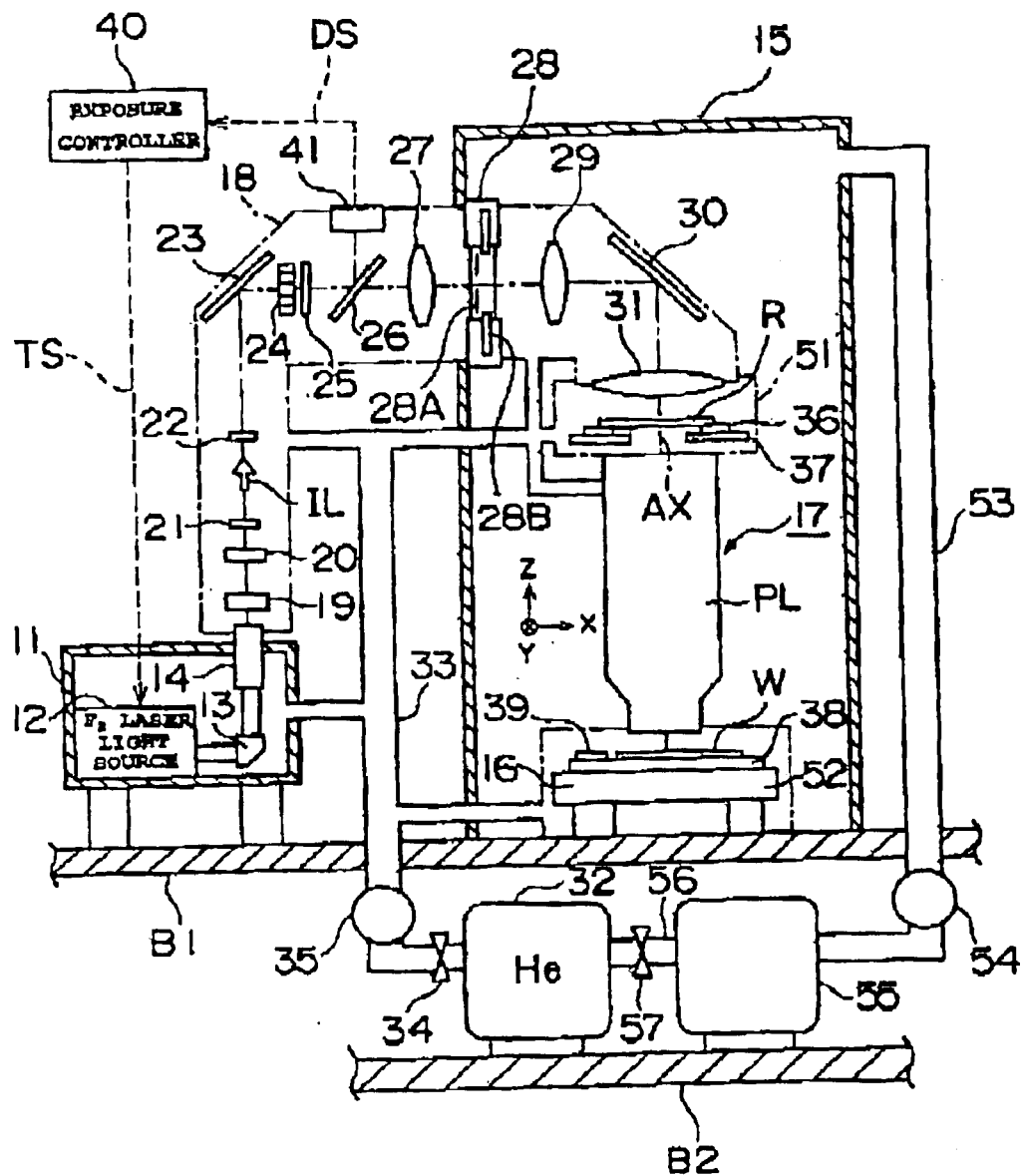
FIG. 1 in an overall configuration of a projection exposure apparatus of a step-and-scan system according to an embodiment of the present invention.

FIG. 1 is a view of an overall configuration of an exposure apparatus according to an embodiment of the present invention. The exposure apparatus is a reduction projection exposure apparatus of a step-and-scan system.

In FIG. 1, the projection exposure apparatus in placed in a clean room a floor B1 in a semiconductor manufacture plant, and a gas cylinder (a supply unit) 32 for supplying a gas through which exposure light transmits, for example, an inert gas (a helium gas in the present embodiment) to the exposure apparatus and a purifying unit 55 for collecting and purifying the gas are installed in so-called a machine room (utility space) on a floor B2 below the floor B1.

In the clean room on the floor B1, a box-shaped case 11 is arranged via a vibration isolation base and inside the case 11 in provided with an $F_2$ laser light source 12 (oscillation wavelength of a main light is 157 nm) as an illumination light source, a beam matching unit (BMU) 13 including a movable mirror, etc. for positionally matching a light path with an exposure body unit, and a light blocking pipe 14 inside which an illumination light transmits. The laser light source 12 is comprised of a laser oscillator wherein a mixture of a helium gas and a fluorine gas ($F_2$) is sealed as a buffer gas and a high-voltage power supply for applying a voltage to an electrode of the laser oscillator, etc.

A box-shaped environment chamber 15 having preferable airtightness is placed next to the case 11, a surface plate 16 in placed on the floor B1 inside the environment chamber 15 via a vibration isolation base for reducing vibration from the floor, and a wafer stage 38 is placed on the surface plate 16. Further, a sub-chamber 18 having a preferable airtightness is built from the pipe 14 protruding from the case 11 to inside the environment chamber 15, and most of the illumination optical system is housed in the sub-chamber 18.

During exposure, an exposure light (pulse light) IL as an exposure light (a wavelength of a main light in 157 nm) emitted from the $F_2$ laser light source 12 inside the case 11 passes through the BUM 13 and the pipe 14 to reach inside the sub-chamber 18. In the sub-chamber 18, the exposure light IL passes through a beam shaping optical system comprising a beam expander 19, a variable attenuator 20, lens systems 21 and 22, etc., is reflected on a reflection mirror 23 for bending the light path, and irradiates on a fly-eye lens 24 (a rod-lens may be used instead of the fly-eye lens) as an optical integrator.

The fly-eye lens 24 forms a large number of secondary light sources to illuminate a later explained reticle R by a uniform illumination distribution. On an emission surface of the fly-eye lens 24 is arranged an aperture stop 25 of the illumination system, and the exposure light IL emitted from the secondary light sources inside the aperture stop 25 irradiates on a beam splitter 26 having a small reflectance and a large transmittance. The exposure light IL transmitted the beam splitter 26 goes through a condensing lens system 27 and passes through a rectangle opening portion of a reticle blind mechanism 28.

The reticle blind mechanism 20 is arranged near a conjugate surface with respect to a pattern surface of the reticle. Further, inside the reticle blind mechanism 28 is provided a fixed illumination field stop (fixed blind) 28A and a movable blind 28B for changing a width of an illumination field region in the scanning direction besides the fixed blind. At the time of starting and ending scan exposure, exposure on an unnecessary part is prevented by further limiting the illumination region via the movable blind.

The exposure light IL shaped to be a slit shape by the fixed blind of the reticle blind mechanism 28 passes through a imaging lens system 29, a reflection mirror 30 and a main condensing lens system 31 and irradiates on the illumination region in a slit shape on a circuit pattern region on the reticle R with a uniform intensity distribution. In the present embodiment, those from an emission face of the light blocking pipe 14 to the main condensing lens system 31 are housed in the sub chamber 18, furthermore, a space from inside the pipe 14 to the emission face of the $F_2$ laser light source 12 is sealed by the case 11, as well. Inside the sub chamber 18 and the case 11 are supplied a temperature-controlled helium gas (He) of a predetermined purity or more from the helium cylinder 32 via a piping 33. The piping 33 is provided with a open/close valve 34 and a pump 35, so that it is possible to switch supplying or stopping of the helium gas to the projection exposure apparatus by opening or closing the open/close valve 34 and controlling an operation of the pump 35 by a not shown control system.

An image of a circuit pattern in the illumination region of the reticle R is transferred the exposure light IL to an exposure region in a slit shape on a resist layer on the wafer W via a projection optical system PL. The exposure region positions on one shot region among a plurality of shot regions on the wafer W. The projection optical system PL of the present embodiment is a dioptric system, but since glass materials through which an ultraviolet ray having a short wavelength as such transmits is limited for example to fluorite and quartz, etc., it is preferable to improve transmittance of the exposure light IL in the projection optical system PL by changing the projection optical system PL to a catadioptric system or a catoptric system. Below, an explanation will be made by setting the Z axis in parallel with a light axis AX of the projection optical system PL, the X axis in parallel with a paper face of FIG. 1 on a plane vertical to the Z axis and the Y axis vertical to the paper face of FIG. 1.

The reticle R is held by suction on a reticle stage 36 and the reticle stage 36 is mounted movable at a constant speed in the X direction (scanning direction) on a reticle base 37 and also slightly movable in the X direction, Y direction and the rotation direction. A two-dimensional position and a rotation angle of the reticle stage 36 (reticle R) are controlled by a not shown drive control unit provided with a laser interferometer.

On the other hand, the wafer W is held by suction on a not shown wafer holder provided on the wafer stage 38. The wafer stage 38 in mounted on the surface plate 15. The water stage 38 controls a focal position (a position in the Z direction) and an inclination angle of the wafer W in an auto-focus method to align the surface of the wafer W with an image surface of the projection optical system PL and performs constant speed scanning on the wafer W in the X direction and stepping in the X direction and Y direction. A two-dimensional position and a rotation angle of the wafer stage 38 (wafer W) are also controlled by the not shown drive control unit provided with a laser interferometer.

At the time of scan exposure, in synchronization with the reticle R scanned at a speed Vr in the +X direction (or −X direction) with respect to an illumination region of the exposure light IL via the reticle stage 36, the wafer W is scanned at a speed β· Vr (β is a projection magnitude from the reticle R to the wafer W) in the −X direction (or +X direction) with respect to the exposure region via the wafer stage 38.

Further, a reticle chamber 51 is provided like covering a space including portions between the illumination optical system and the reticle R, and the reticle R and the projection optical system PL, and a wafer chamber 52 is provided like covering a space including a portion between the projection optical system PL and the wafer W. In a space inside a lens barrel of the projection optical system PL (a space between a plurality of lens elements) and inside the reticle chamber 51 and the wafer chamber 52, a temperature-controlled helium gas of a predetermined concentration or more is supplied from the helium cylinder 32 via the piping 33 in the same way as in the case 11 and sub chamber 18. Note that inside the environment chamber 15 is supplied a nitrogen gas from a not shown nitrogen cylinder.

Inside the environment chamber 15, the helium gas leaked from the sub chamber 18, the lens barrel of the projection optical system PL, the reticle chamber 51 and the wafer chamber 52 is lighter than the nitrogen gas in the environment chamber 15, so it goes up to remain in a space near the ceiling. The gas in the space near the ceiling is a mixed gas including nitrogen and the air entered from the outside the environment chamber 15 besides the helium gas.

One end of the piping 53 is connected to near the ceiling on side walls of the environment chamber 15 and the other end of the piping 53 passes through an opening formed on the floor B1 and connected to the purifying unit 55 on the floor below. A suction pump (or a fan) 54 is arranged in the middle of the piping 53 on the bottom side of the floor B1, a collecting system is composed of the piping 53 and the pump 54, and the mixed gas taken from the upper space of the environment chamber 15 is sent to the purifying unit 55 on the floor below.

While not illustrated in detail, the purifying unit 55 is comprised of a dust-collecting drainage unit for removing minute dusts and water from the mixed gas, a cooling separation unit for cooling the mixed gas to a temperature of liquid nitrogen by thermo-block compression cooling to liquidate only nitrogen and separate a helium gas, a chemical filter for further removing contaminated substances left in the separated helium gas, etc. The helium gas purified in the purifying unit 55 is returned to the helium cylinder 32 via the piping 56 and the valve 57 to be supplied again. In the present embodiment, the exposure apparatus body 17 is comprised of a wafer stage 38 for holding the wafer W, the projection optical system PL, the reticle stage 36 for holding the reticle R, and at least a part of the illumination optical system (for example, a part of the illumination optical system arranged inside the environment chamber 15).

Controlling Exposure Light Amount

Near the wafer W on the wafer stage 38 is provided an illuminance meter 39 as a light sensor comprised of a photoelectric transfer element. A light receiving surface of the illuminance meter 39 is set to be the same level as the surface of the wafer W. As the illuminance meter 39, a silicon photodiode being sensitive to far-ultraviolet range and having a high response frequency for detecting a pulse illumination light, etc. can be used. Note that as the illuminance meter 39, a pyroelectric or thermal actinometer may be used. A detection signal of the illuminance meter 39 is supplied to an exposure controller 40 via a not shown peak hold circuit and an analog/digital (A/D) converter.

On the other hand, the exposure light IL reflected on the beam spritter 26 is received by an integrator sensor 41 as a light sensor comprised of photoelectric transfer element via a not shown convergence lens, and a photoelectric transfer signal of the integrator sensor 41 in supplied as an output DS (a digital signal) to the exposure controller 40 via the not shown peak hold circuit and the A/D converter. Note that as the integrator sensor 41, a silicon photodiode, a pyroelectric or thermal actinometer, etc. can be used. Note that sometimes in the present embodiment, an optical system from the laser light source 12 to the wafer W is called a main optical system, and an optical system separated from the main optical system by the beam spritter 26 to reach the integrator sensor 41 is called a branch optical system.

The correlative coefficient of the output DS of the integrator sensor 41 and pulse energy (exposure light amount) of the exposure light IL per unit area on the surface (image surface) of the wafer W in obtained in advance based on a measurement value by the integrator sensor 41 and a measurement value of the illuminance meter 39 and stored in an exposure controller 40. The measurement for obtaining the correlative coefficient is made before starting the exposure processing or in accordance with need. The exposure controller 40 controls a light emission timing and light emission power, etc. of the light source 12 by supplying control information TS to the laser light source 12 in synchronization with operation information of a stage system from a not shown stage controller. Furthermore, the exposure controller 40 controls transmittance by switching a filter of the variable attenuator 20. The not shown stage controller controls an operation of opening and closing of the movable blind of the blind mechanism 28 in synchronization with the operation information of a stage system.

Next, basic control of an exposure light amount during scan exposure will be explained. The exposure controller 40 sets a targeted value of pulse energy of the laser light source 12 at the time of the next pulse emission by performing direct feedback of the output DS of the integrator sensor 41. Namely, in accordance with known sensitivity of a photoresist applied on the wafer W input for example by an operator, a targeted exposure light amount $S_0$ as a targeted value of a cumulative exposure light amount for respective points on the wafer W are determined and a minimum exposure pulse number Nmin of the exposure light IL for the respective points on the wafer W is determined based on known unevenness of pulse energy of the laser light source 12 and necessary exposure light amount control reproduction accuracy set in advance.

Based on the parameters, the exposure controller 40 suitably sets transmittance of the variable attenuator 20, makes the laser light source 12 actually emit predetermined number of pulses, measures average pulse energy P on the wafer W via the integrator sensor 41, and divides the targeted value $S_0$ of the cumulative exposure light amount by the measurement result so as to obtain the exposure pulse number N. Note that actually, the $S_0/P$ is not always an integer, so a value of the $S_0/P$ made to be an integer is used.

Here, for simplification, an explanation will be made assuming that the $S_0/P$ is an integer.

Then, when the obtained exposure pulse number N is already Nmin or more, it changes to exposure as it is, while when the exposure pulse number N is smaller than Nmin, the exposure controller 40 improves transmittance of the variable attenuator 20 in a range that the exposure pulse number N becomes Nmin or more. When the transmittance at this time is T, the exposure pulse number N becomes $(S_0/(P \cdot T))$. Actually, since $(S_0/(P \cdot T))$ is not always an integer, it has to be made to be an integer. But here, It is assumed to be an integer for simplification. As a result, targeted energy per one pulse becomes $S_0/N$.

Also, when assuming a width (a slit width) of a slit shaped exposure region on the wafer W shown in FIG. 1 in the scanning direction is D, an oscillation frequency (or a reciprocal number of a pulse repetition cycle) of the laser light source 12 is F, and a scan speed of the wafer W during scan exposure in V, a distance the wafer W moves during pulse emissions is V/F, so the exposure pulse number N is expressed by the formula below.

$$N=D/(V/F) \quad (1)$$

Namely, the slit width D and the oscillation frequency F, etc. have to be reset to obtain the exposure pulse number N. Note that since the slit width D is normally constant, at least one of the oscillation frequency F and the scanning speed V is set so as to conform to the formula (1) and information of the scanning speed V in supplied to the stage controller.

At the time of scan exposure thereafter, after giving the laser light source 12 an instruction to start pulse emission, the exposure controller 40 let the laser light source 12 to perform pulse emission at a frequency F so that an average value of the respective pulse energy on the wafer W detected by the integrator sensor 41 becomes $S_0/N$ until the emission pulse number reaches $N_{min}$ (or a predetermined number) as an example. In parallel with this, the exposure controller 40 obtains an exposure light amount $P_i$ on the wafer W from the output DS from the integrator sensor 41 for every pulse light, and the exposure light amount $P_i$ is integrated to obtain an actual integrated exposure light amount (a sum of movement) on the wafer W. Then, after the emission pulse number reaches $N_{min}$, a voltage to be applied at the time of the next pulse emission of the laser light source 12 is controlled so that a integrated exposure amount (move window) ST for a series of $N_{main}$ pulses always becomes a next targeted value successively. A time for $N_{min}$ pulses may be considered an a unit time for the control system. Note that the voltage is determined considering a condition of a gas inside a laser resonator of the laser light source 12 and a condition of a laser resonator.

$$ST=N_{min} \cdot (S_0/N) \quad (2)$$

At the time of pulse emissions of k, (k+1), (k+2), . . . , an application voltage by a high-voltage power supply is controlled so that the integrated exposure light amount ST for $N_{min}$ pulses up to then respectively becomes close to the formula (2), and fine adjustment in made on energy per one pulse in the laser light source 12. As a result, an integrated exposure light amount to attain the targeted value $S_0$ is given for respective points on the wafer W after the scan exposure at required accuracy of controlling the exposure light amount.

Countermeasure to Read Light

The light source of the present embodiment is an $F_2$ laser light source using a helium gas as a buffer gas, so a red light (sub light) having a wavelength of 630 to 720 nm or so in collaterally generated when oscillating a main light having a wavelength of 157 nm. The variety of light sensors (the illuminance meter 39 and the integrator sensor 41) in the present embodiment use a photodiode, etc. having sensitivity to such a red light. Thus, detection values thereof include not only the main light which contributes to exposure, but the sub light which does not contribute to exposure. Particularly, because of different attenuation rate in a light path between the main light and the sub light (the main light has a higher attenuation rate), an error arisen in the detection result. When the above exposure light amount control is performed based on the detection result, a sufficiently highly accurate pattern cannot be formed in some cases. Below, countermeasures to this will be explained.

First Countermeasure

Figure 2:
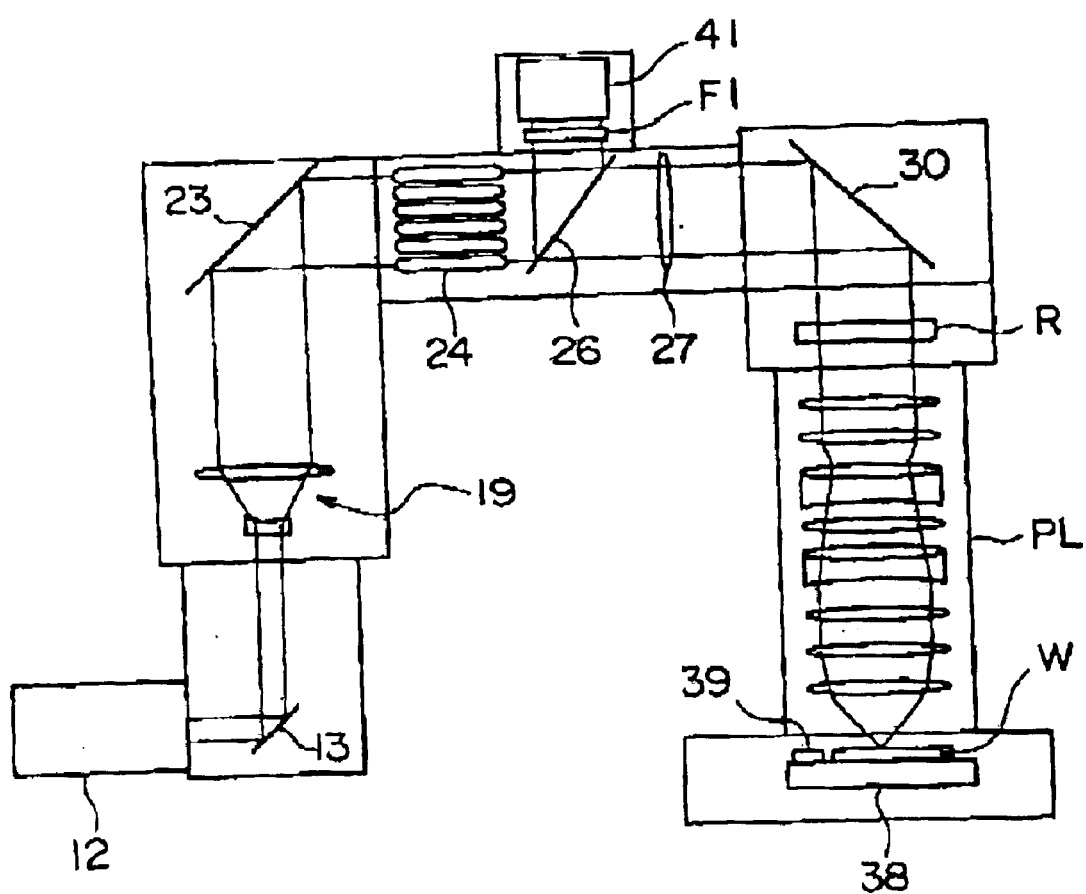
FIG. 2 is a view of the configuration for explaining a first countermeasure to a red light of an embodiment of the present invention.

FIG. 2 is a view of a first red light countermeasure and shows a key part of the exposure apparatus shown in FIG.1. In this example, a filter F1 is provided inside a light path of the exposure light in the branch optical system, that is, between the beam splitter 26 and the integrator sensor 41. The filter F1 is configured by forming a dielectric thin film, a dielectric multilayer film, a metal film, a metal multilayer film, a composite film of dielectric and metal, etc. on one or both surfaces of a base member through which a vacuum ultraviolet ray of fluorite, etc. passes through with a small loss and is an optical filter which has optical characteristics of allowing a light having a short wavelength range (for example 190 nm or less) including a wavelength range of around 157 nm to pass through it, while, absorbing, scattering or reflecting a light having a long wavelength range (for example 190 nm or more) including a wavelength range of 630 to 720 nm or so. Note that as the filter F1, those capable of realizing the above optical characteristics by using a Fabry-Perot type resonator, prism, a diffraction lattice, etc. may be adopted.

A light emitted from the laser light source 12 and reflected on the beam spritter 26 includes a main light ML having a wavelength of 157 nm and a red light as a sub light SL, however, the main light ML and the sub light SL are separated and the sub light SL in removed by the filter F1 and a light wherein the main light ML occupies a large ratio transmits. Accordingly, only the main light not including the red light incidents the integrator sensor 41, so a detection error caused by an effect of the red light can be suppressed small even if the light sensor 41 in sensitive to the red light. Thus, control of exposure light amount can be accurately performed by using the detection result. Note that since it is substantially impossible to separate the red light by 100% by the filter, it is sufficient if it is attenuated to a degree not giving an adverse effect on a detection result of the light sensor 41.

Further, by using the detection result by the light sensor 41, accuracy of monitoring can be improved when monitoring an attenuation rate (including transmittance of the above lens and reflectance of a reflection mirror) of an exposure light generated by optical members (including a lens 27, a plurality of lens composing the projection optical system, reflection mirror 30, etc.) between the beam spritter 26 to the optical element on the wafer side of the projection optical system, an absorption rate of the exposure light caused by exposure light absorbing substances existing in a space between optical members and in the reticle chamber 51 housing the reticle R, or illumination unevenness in an exposure region on the wafer surface.

For example, when airtightness of the case 11, the sub chamber 18, a lens barrel of the projection optical system PL declines and an outside air (the air wherein the exposure apparatus is placed including oxygen and water, etc. which absorb the main light) enters into at least one of these spaces, the transmittance of the main light passing through the space declines, so changes of the illumination and a light amount over time can be detected. In this case, a light including the main light ML and the sub light SL irradiates on the illuminance meter 39 on the wafer stage.

However, even if the outside air enters into at least one space, almost no change is brought to transmittance of the red light itself. Accordingly, since the light sensor 41 detects a light after being removed the sub light SL wherein the main light ML occupies a large ratio, a reaching rate of a light wherein the main light ML occupies a large ratio reaches the light sensor 39 from the beam splitter 26 (in other words, the attenuation rate caused by light absorbing substances existing in the optical members and light path space) can be accurately detected.

Namely, entering of the outside air to at least one space in the light path of the main optical system and a contaminating state of a regions in which the exposure light passes through on the optical member surface can be accurately detected on a minor stage. Further, when irradiation of a vacuum ultraviolet ray to a surface of optical members arranged between the beam spritter 26 for the vacuum ultraviolet ray to the light sensor 39 in stopped, impurity substances (indicating light absorbing substances here) existing in the space adhere to the surface of the optical members. However, when irradiation of the vacuum ultraviolet ray in started again, so-called a cleanup effect arises and the impurity substances adhered on the surface of the optical members are removed from the surface. In the present embodiment, an optical cleanup effect as such can be accurately confirmed by outputs of the light sensor 39 and the light sensor 41.

Note that the filter may be separately provided in the main optical system for separating red light irradiated on the illuminance meter 39 from the main light to enable the illuminance meter 39 to detect a light wherein the main light ML occupies a large ratio. When providing the filter immediately before the integrator sensor 41 and the illuminance meter 39, the filter may be provided integrally an one body with the integrator sensor 41 and the illuminance meter 39 to be a part thereof.

Figure 3:
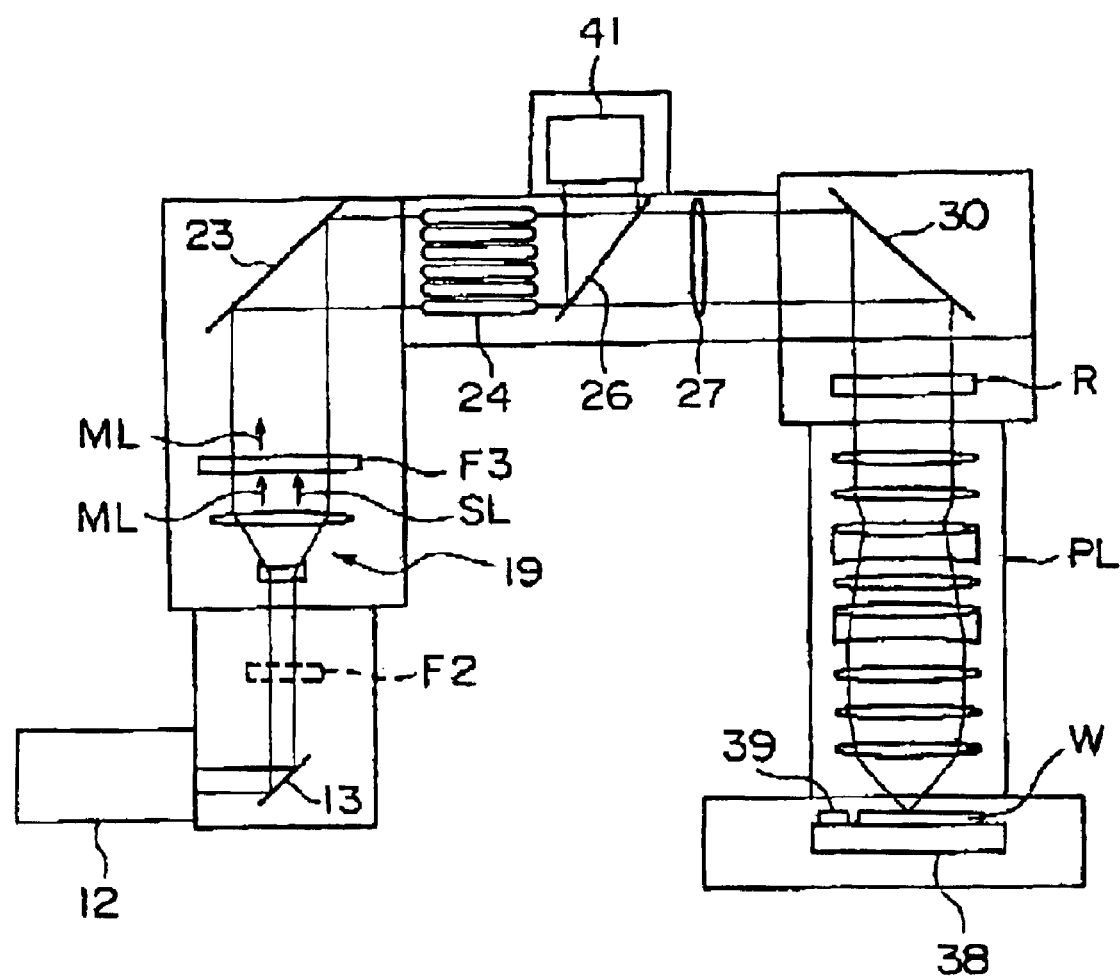
FIG. 3 is a view of the configuration of an example of changing a position of a filter in the first countermeasure to a red light of an embodiment of the present invention.

Further, as shown in FIG. 3, a filter F3 may be provided on the downstream side (the wafer W side) of the beam expander 19 in the light path of the illumination optical system. In this configuration, the filter F3 is provided on the upstream side (the light source side) of the beam spritter 26, so one filter can deal with both of the integrator sensor 41 and the illuminance meter 39 and is advantageous in terms of costs and optical characteristics (attenuation is small). Further, by arranging the filter F3 on the downstream side of the beam expander 19, a sectional area of the exposure light is enlarged by the beam expander 19, so energy density declines and durability of the filter F3 can be made long. Note that the position of arranging the filter may naturally be a position on the upstream side of the beam expander 19 (for example indicated by the reference number F2 in FIG. 3).

Furthermore, in the above embodiment, one filter F3 is provided, but a plurality of filters may be arranged collectively at one position or arranged separately.

Second Countermeasure

Figure 4:
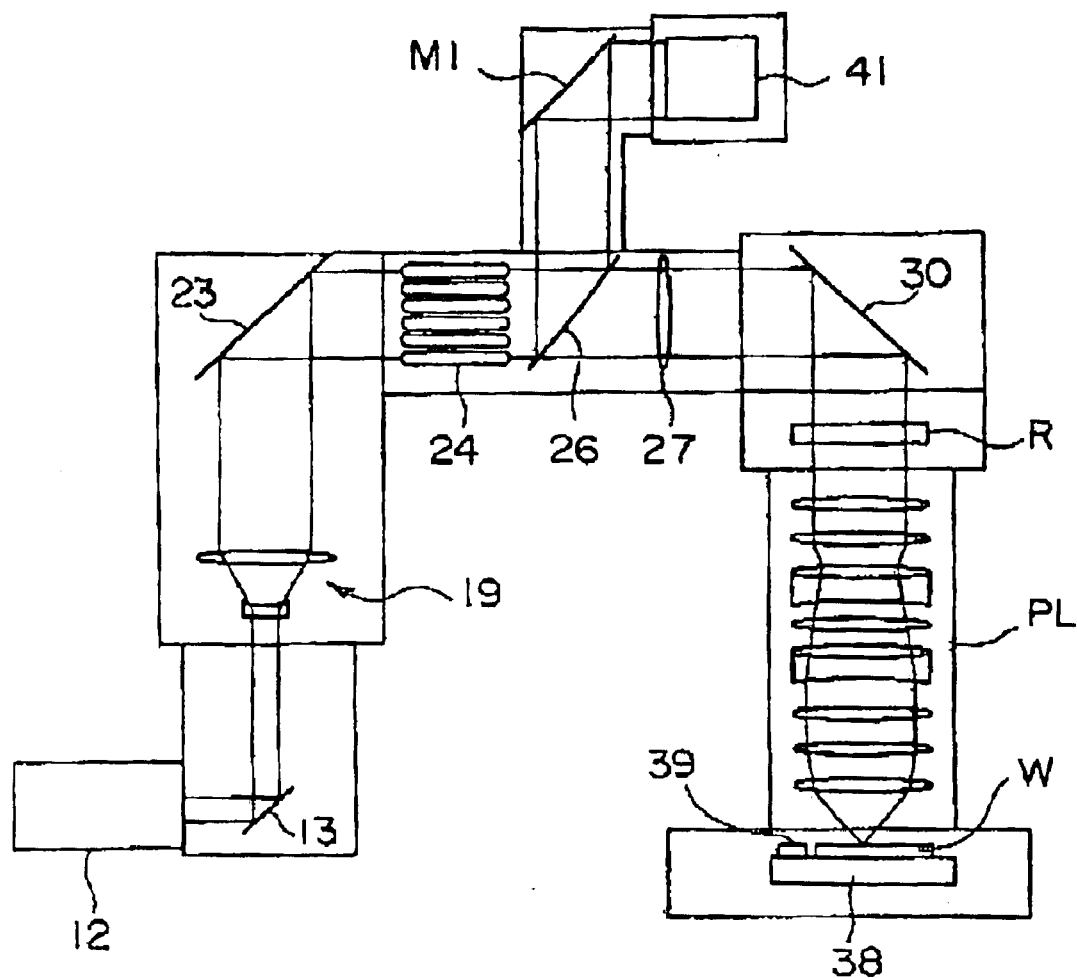
FIG. 4 is a view of the configuration for explaining a second countermeasure to a red light of an embodiment of the present invention.

FIG. 4 is a view of a second countermeasure to the red light showing a key part of the exposure apparatus in FIG. 1. In the embodiment, a different point is, instead of the filter F1 used in the first countermeasure, a dichroic mirror M1 in provided an the light path branched by the beam spritter 26 as a branch optical system, that is, between the beam spritter 26 and the integrator sensor 41. Configurations and operations other than that are the same as those in the first countermeasure, so the explanation will be omitted.

The dichroic mirror M1 is a reflection transmission type mirror having optical characteristics of reflecting a light having a short wavelength (for example 190 nm or less) including a wavelength range around 157 nm and allowing a light having a long wavelength range (for example 190 nm or more) including a wavelength range of 630 to 720 nm or so pass through it.

Figure 5:
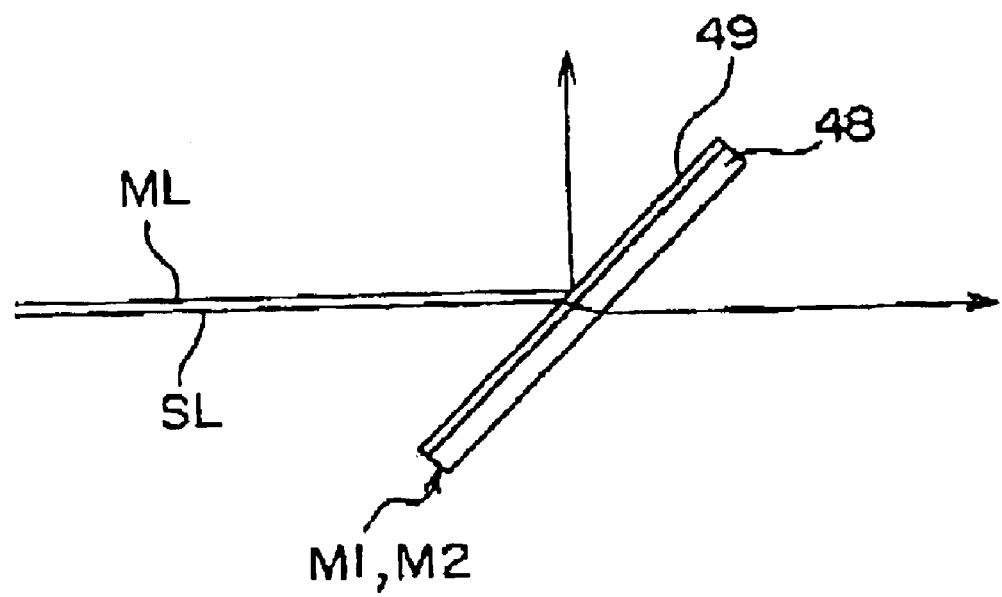
FIG. 5 in a view of the configuration of a dichroic mirror in the second countermeasure to a red light of an embodiment of the present invention.

The dichroic mirror M1 is, for example as shown in FIG. 5, configured by forming a dielectric multilayer film 49 made by fluoride on a surface of a base member 48 which allows a vacuum ultraviolet ray of fluorite, etc. with a small loss, reflects the main light ML and allows the sub light (red light) SL pass through it.

Figure 6:
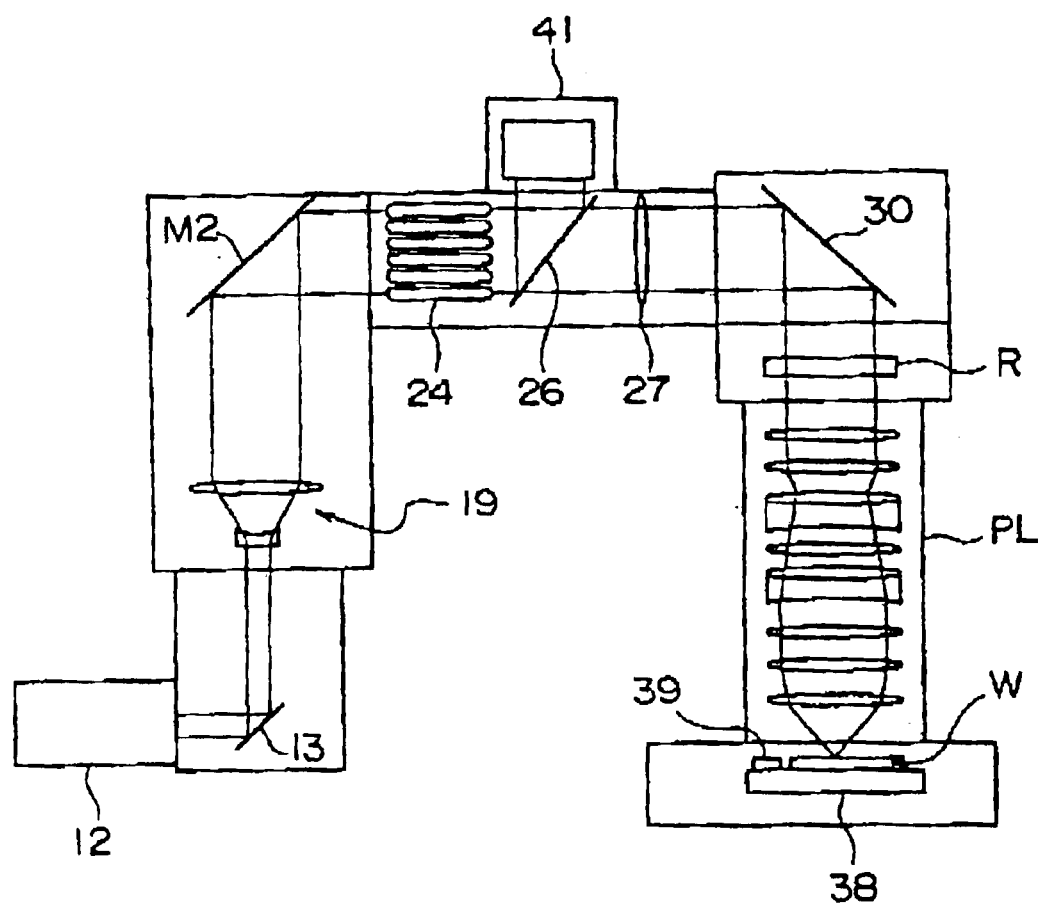
FIG. 6 is a view of the configuration of an example of changing a position of the dichroic mirror in the second countermeasure to a red light of an embodiment of the present invention.

Note that as a modification example, as shown in FIG. 6, a dichroic mirror M2 may be provided instead of the reflection mirror 23 without arranging the dichroic mirror M1 on the light path of the branch optical system. In this configuration, since the dichroic mirror M2 is arranged on the downstream side (wafer W side) of the beam expander 19, energy density of the exposure light is low comparing with the case of providing it on the upstream side (laser light source 12 side) of the beam expander 19. Consequently, durability of the dichroic mirror M2 can become long. Note that the position of arranging the dichroic mirror may be on the upstream saide of the beam expander 19.

Furthermore, in the above embodiment, one dichroic mirror M2 is provided, but a plurality of dichroic mirrors may be separately arranged on the light path of the exposure light of the branch optical system or arranged in combination with the above optical filters F1 to F3.

Third Countermeasure

Figure 7:
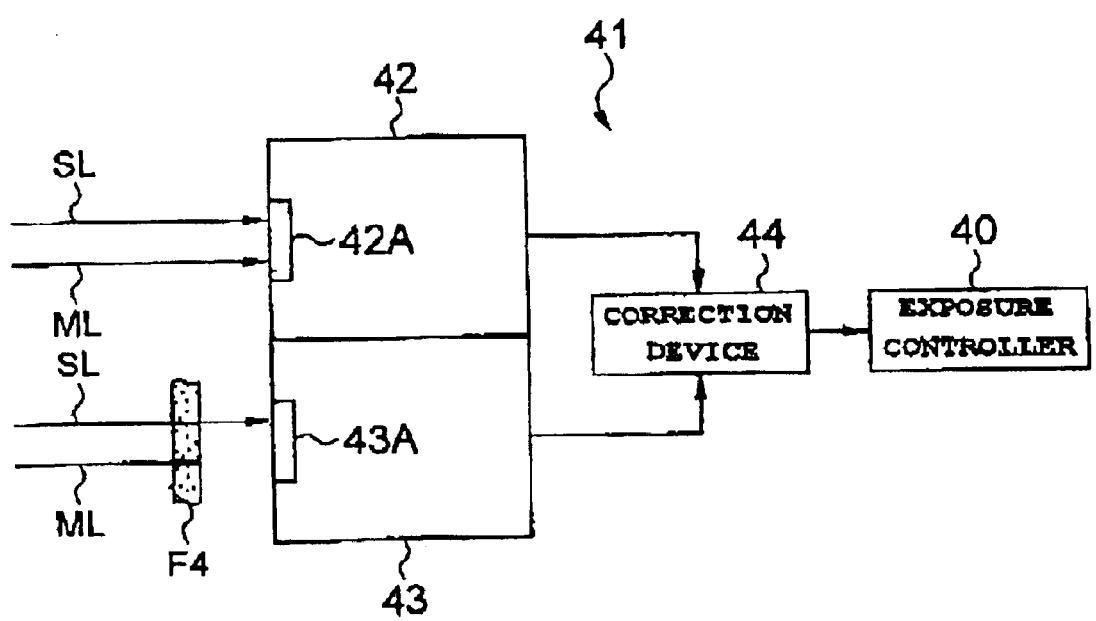
FIG. 7 is a view of the configuration for explaining a third countermeasure to a red light of an embodiment of the present invention.

FIG. 7 is a view of a third countermeasure showing the integrator sensor 41 and its surrounding. In the present embodiment, identical sensors 42 and 43 (the same sensors as the integrator sensor 41) are arranged adjacent to each other in place of the integrator sensor 41 in FIG. 1. The branch optical system branched by the beam splitter 26 in FIG. 1 is further branched to two (equally divid light sensor 42 and the other irradiates on the light sensor 43, and a filter F4 is provided on the light path of the light sensor 43.

The filter F4 has almost opposite optical characteristics from those of the above filters F1 to F3, and is an optical filter having optical characteristics of allowing a light having a long wavelength range (for example 190 nm or more) including a wavelength range of 630 to 720 nm or so and absorbing, scattering or reflecting, etc. a light having a short wavelength range (for example 190 nm or less) including a wavelength range of 157 nm or so.

As the filter F4, an optical glass, a quartz, an acrylic plate, a plastic plate, sodium chloride, etc. can be adopted and high transmittance to the red light is preferable. Also, oxygen, water, carbon dioxide, carbon monoxide, organics, silica compound and other gases to remarkably attenuate a vacuum ultraviolet ray may be introduced or provided by sealing it in some kind of case on the light path to the light sensor 43.

A light including both the main light ML and the sub light SL irradiates on a light receiving surface 42A of the light sensor 42, while a light wherein the main light ML is separated by the filter F4 and a large ratio is occupied by the sub light SL irradiates on a light receiving surface 43A of the light sensor 43.

Respective detection values of the light sensor 42 and the light sensor 43 are supplied to the correction device 44. The correction device 44 subtract the detection value of the light sensor 43 (a detection value including only the sub light) from that of the light sensor 42 (a detection value including both of the main light and the sub light) to obtain a detection value of light information (for example, light intensity, light amount, illumainance, etc.) of the main light and supplies the same as a detection result DS by the integrator sensor 41 to the exposure controller 40.

The filter F4 of the present embodiment is a separation device for separating the sub light SL from the main light ML and letting the sub light pass through it. Generally, substances allowing a vacuum ultraviolet ray are limited, while there are a variety of substances which absorb it. Thus, the filter F4 is advantageous in having a simple configuration and low costs comparing with the filters F1 to F3 through which a vacuum ultraviolet ray can transmit but not the red light.

Note that in the above explanation, the branch optical system branched by the beam splitter 26 from the main optical system was further branched to two and introduced to the pair of light sensors 42 and 43, but it also may be configured so that the light receiving surfaces 42A and 43A of the light sensors 42 and 43 are made smaller than the sectional area of the branched lights and that the branched lights respectively irradiate simultaneously on the light receiving surfaces 42A and 43A without branching the branch optical system to two.

Further, the explanation was made on the integrator sensor 41 above, but the same configuration can be applied to the illuminance meter 39.

Fourth Countermeasure

Figure 8:
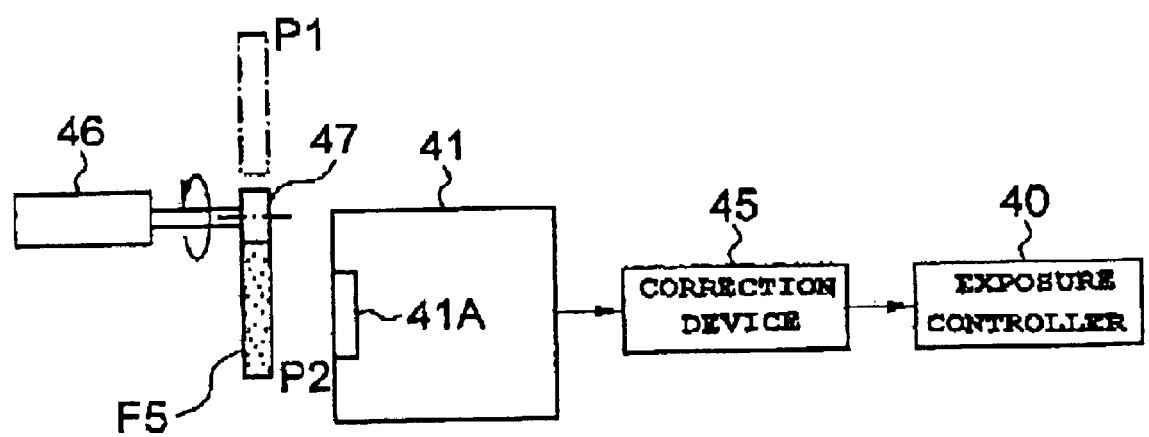
FIG. 8 is a view of the configuration for explaining a fourth countermeasure to a red light of an embodiment of the present invention.

FIG. 8 is a view of a fourth countermeasure to the red light showing the integrator sensor 41 and its surroundings. In this countermeasure, the configuration is almost the same as that shown in FIG. 3, but instead of the filter F3, a filter F5 is provided immediately before the light receiving surface 41A of the integrator sensor 41. The filter F5 is a filter which separates the main light and allows only the sub light to pass through it as same as the above F4 filter, so the explanation will be omitted.

The filter F5 is configured to selectively move to a second position P2 immediately before the light receiving surface 41A of the integrator sensor 41 and to a first position P1 which is out of the second position P2. Namely, the filter F5 is fixed to a holder 47 and the holder 47 is rotationally driven by a drive motor 46. The filter F5 can move at a high speed between the first position P1 and the second position P2 by being driven by the drive motor 46. Note that as a move device, one directly sliding the filter F5 between the first position P1 and the second position P2 also may be adopted.

When the filter F5 in at the first position P1, a light including both of the main light ML and the sub light SL irradiates on the light receiving surface 41A of the integrator sensor 41, while when the filter F5 is at the second position P2, a light wherein the main light ML is separated by the filter F5 and the sub light SL occupied a large ratio irradiates on the light receiving surface 41A of the integrator sensor 41.

In this countermeasure, a detection value by the integrator sensor 41 is supplied to the exposure controller 40 via the correction device 45. The correction device 45 subtracts the detection value by the integrator sensor 41 when the filter F5 is at the second position P2 (a detection value including only the sub light) from the detection value by the integrator sensor 41 when the filter F5 is at the first position P1 (a detection value including both of the main light and the sub light) to calculate a detection value of the main light and supplies the same as a detection result DS by the integrator sensor 41 to the exposure controller 40.

The filter F5 in the present embodiment is a separation device for separating the sub light SL from the main light ML and letting the sub light SL pass through it in the same way as in the above filter F4. Generally, substances allowing a vacuum ultraviolet ray are limited, while there are a variety of substances which absorb it. Thus, the filter F5 is advantageous in having a simple configuration and low costs comparing with the filters F1 to F3 through which a vacuum ultraviolet ray can transmit but not the red light. Furthermore, in addition to this, it is unnecessary to provide two optical sensors (42 and 43) an in the fourth countermeasure as above, so the configuration becomes simpler.

Control of switching the position of the filter F5 by the move devices 46 and 47 is performed by a not shown control device and a switching cycle preferably is as quick as possible. For example, it is preferable that a cycle of switching the positions P1 and P2 can be made for every pulse of pulse oscillation by the laser light source 12. It is because illuminance of the exposure light change over time, accuracy of the detection result can be improved when switching is performed by a quick cycle.

Further, the explanation was made on the integrator sensor 41 above, but the same configuration can be applied to the illuminance motor 39.

Others

The above explained embodiments are for easier understanding of the present invention and not for limiting the present invention. Accordingly, elements disclosed in the above embodiments include all design modifications and equivalents belonging to the technical field of the present invention.

The explanation above was made on the integrator sensor 41 or the illuminance meter 39, but other than that, a variety of light sensors are provided to the exposure apparatus. For example, other than the illuminance meter 39, the wafer stage 38 is also provided with a illuminance unevenness sensor comprised of a similar photoelectric transfer element, and the present invention can be applied to a illuminance unevenness sensor as such.

A cover glass is arranged on the light receiving surface of the light sensor used in the present embodiments. The cover glass is formed by the same glass material as those composing the optical system of the exposure apparatus of the embodiments.

The cover glass in arranged in a space on the light path, that is, a space filled with an inert gas. Therefore, on a surface of the cover glass, removal of light absorbing substances adhered to the glass surface occurs due to the optical cleanup effect by irradiation of a vacuum ultraviolet ray. Also, when irradiation of the vacuum ultraviolet ray in stopped, there arises a phenomena that light absorbing substances existing in the space adhere to the surface of the cover glass. The light absorbing substances include an out gas generated from a variety of parts (wiring and circuit substrate, etc.) composing the sensor itself. Therefore, there is a possibility that an output of the light sensor changes as a result of adhesion of the light absorbing substances and optical cleanup. Accordingly, it is preferable that light information of an exposure light detected in a state where light absorbing substances are not adhered on the cover glass surface due to the optical cleanup effect is stored as reference and that an actual measurement value and the stored reference are compared at a predetermined timing.

Further, when the values do not match as a result of the comparison, calibration is preferably performed. When performing calibration on a sensor, a reference light sensor having the same detection sensitivity as that of the light sensor mounted an the exposure apparatus may be prepared in advance to perform calibration on the light sensor mounted on the exposure apparatus based on the detection result of the reference light sensor.

In the case of the integrator sensor, comparison can be made for every pulse, while, the illumination meter is capable of comparing at the time of detecting illuminance, for example, for every time a wafer is exchanged.

In the above embodiment, an explanation was made on the configuration of replacing the light path of the exposure light with a helium gas, but gases of nitrogen, argon, neon, and krypton, etc. or a mixed gas thereof or gases (called an inert gas) having characteristics of a small absorbency to lights outside a vacuum ultraviolet range may be used. Also, the light path of the exposure light may be divided to two or more, and respective divided light paths may have different kinds of gases. For example, it may be divided to an illumination optical system, a reticle chamber, a projection optical system and a wafer chamber, and the projection optical system may be replaced by a helium gas, and the rest with a nitrogen gas. Furthermore, it may be configured that a gas always flows between the projection optical system and the wafer without providing the wafer chamber.

As a glass material composing the optical system of the exposure apparatus, other than fluorite and quartz, etc., crystals, such a lithium fluoride, magnesium fluoride, strontium fluoride, lithium-calcium-aluminum-fluoride, and lithium-strontium-aluminum-fluoride, and improved quartz, such as glass fluoride comprising zirconium-barium-lanthanum-aluminum, quartz glass doped with fluoride, quartz glass doped with hydrogen in addition to fluoride, quartz glass containing an OH group, quartz glass containing an OH group and fluoride, etc. may be used.

In the above, a reduction projection exposure apparatus of step-and-scan system (scanning stepper) was explained, but the present invention can be applied to a reduction projection exposure apparatus of step-and-repeat system for irradiating an exposure light on the entire reticle pattern in a state in which the reticle and wafer are set still and performing static exposure on one section region (a shot region) on a wafer to which the reticle pattern is to be transferred. Further, the present invention can be applied to a reduction projection exposure apparatus of step-and-stitch system and a mirror projection aligner, etc.

Furthermore, the present invention can be applied not only to an exposure apparatus used in producing a semiconductor element and liquid crystal display element, but to an exposure apparatus used in producing a plasma display, a thin film magnetic head, image pickup device (CCD, etc.), a micro machine, a DNA chip, etc. and to an exposure apparatus for transferring a circuit pattern on a glass substrate or a silicon wafer, etc. for producing a reticle or a mask. Namely, the present invention can be applied regardless of an exposure method and use application, etc. of exposure apparatuses.

In the above embodiment, the $F_2$ laser light source was explained as an example as a light source of the exposure apparatus, but the present invention con be applied to any light sources as far as it collaterally generates an unnecessary light (sub light) besides a main light used for exposure.

The exposure apparatus according to the above embodiment of the present invention (FIG. 1) is produced by electrically, mechanically or optically connecting to assemble respective components shown in FIG. 1, such as an illumination optical system comprising a light source 12 and a variety of optical elements or optical devices including filters F1 to F5 or a dichroic mirrors M1 to M3, an energy control system including an integrator sensor 41 and a illuminance meter 39, a mask alignment system including a reticle stage 36, a water alignment system including a water stage 398, and a projection optical system PL, etc., then, being adjusted in total (an electric adjustment, an operational adjustment, etc.). Note that the exposure apparatus is preferably produced in a clean room wherein the temperature and a degree of cleanness etc. are managed.

To produce a device (IC, LSI and other semiconductor chips, a liquid crystal panel, a CCD, a thin film magnetic head, micro machine, etc.) by using the exposure apparatus of the embodiments of the present invention, function design (for example, circuit designing of a semiconductor device, etc.) of the device is made first in a designing step and patterning designing for realizing the function is made. Successively, in a mask producing step, a mask on which a designed circuit pattern in formed of is produced. While in a wafer producing step, a wafer is produced by using silicon and other materials.

Next, in the wafer processing stop, an actual circuit, etc. is formed on the wafer by lithography technique by using the mask and wafer produced in the above steps. Next, in an assembling step, a chip is made by using the wafer processed in the wafer processing step. The assembling step includes an assembly process (dicing, bonding) and packaging process (chip sealing) and other processes. Finally, in an inspection step, an operation confirmation test, durability test, and other inspections are performed on the devices produced in the assembly step. The device completes after these processes and is shipped.

As explained above, according to the present invention, even in the case of using a light source which emits a light including a main light contributing to exposure and a sub light having a different wavelength from that of the main light, energy of the main light can be accurately measured, consequently, there are effects that exposure light amount controlling and other failure monitoring, etc. can be performed at high accuracy.

The entire content of the disclosure of Japanese Patent Application No. 2000-202980 filed on Sep. 19, 2000, including the specification, claims, drawings, and abstract, is expressly incorporated herein by reference in its entirety.

What is claimed is:

1. An exposure apparatus comprising:
   an exposure body unit which is placed inside an environment chamber and exposes a substrate via a mask having a pattern;
   a light source which is connected to the exposure body unit via a connection unit and which emits a light including a main light having a wavelength to expose said substrate and a sub light having a different wavelength from the wavelength of the main light, the sub light is collaterally generated in accordance with an oscillation of the main light;

a light sensor which is placed inside the exposure body unit and which has sensitivity to at least the wavelength of said main light; and a separation device which is disposed between the connection unit and the light sensor and which separates said main light from said sub light.

2. The exposure apparatus according to claim 1, further comprising a branch optical system which is placed inside the exposure body unit and which introduces a part of said light to said light sensor; and wherein said separation device is disposed between said branch optical system and said light sensor.

3. The exposure apparatus according to claim 1, further comprising a control device which controls a cumulative light amount that is provided to said substrate based on said main light separated by said separation device.

4. The exposure apparatus according to claim 2, further comprising a shift device which selectively shifts said separation device between a first position in which the separation device is out of said light path of the light branched by said branch optical system, and a second position in which the separation device is placed on the light path.

5. The exposure apparatus according to claim 4, further comprising a correction device which corrects a measurement result obtained by said light sensor when said separation device is shifted to said first position based on a measurement result obtained by said light sensor when said separation device is shifted to said second position.

6. The exposure apparatus according to claim 1, wherein said separation device is an optical filter which allows a light having a wavelength range including the wavelength of said main light to pass through the optical filter and which attenuates a light having a wavelength range including the wavelength of said sub light.

7. The exposure apparatus according to claim 1, wherein said separation device is a reflective transmissive type mirror which reflects a light having a wavelength range including the wavelength of said main light and allows a light having a wavelength range including the wavelength of said sub light to pass through the mirror.

8. The exposure apparatus according to claim 1, wherein said light source is an $F_2$ laser light source.

9. An exposure apparatus comprising:

an exposure body unit which is placed inside an environment chamber and exposes a substrate via a mask having a pattern;

a light source which is connected to the exposure body unit via a connection unit and which emits a light including a main light having a wavelength to expose said substrate and a sub light having a different wavelength from the wavelength of the main light, the sub light is collaterally generated in accordance with an oscillation of the main light;

a first light sensor located inside the exposure body unit, and which has sensitivity to a wavelength range including the wavelengths of said main light and of said sub light;

a second light sensor placed inside the exposure body unit, and which has sensitivity to a wavelength range including at least the wavelength of said sub light;

a first branch optical system disposed between the connection unit and the first light sensor, and which introduces a part of said light to said first light sensor;

a second optical system disposed between the connection unit and the second light sensor, and which introduces a part of said light to said second light sensor; and a separation device disposed between said second branch optical system and said second light sensor, which separates said main light from said sub light.

10. The exposure apparatus according to claim 9, further comprising a correction device which corrects a measurement result obtained by said first light sensor based on a measurement result obtained by said second light sensor.

11. The exposure apparatus according to claim 9, wherein said light source is an $F_2$ laser light source.

12. An exposure method for transferring a pattern of a mask onto a substrate, including the steps of:

separating a sub light from an exposure light emitted from a light source, the exposure light including a main light and the sub light, the main light having a wavelength to expose the substrate, the sub light having a different wavelength from the wavelength of the main light, the sub light is collaterally generated in accordance with an oscillation of the main light;

measuring energy of said exposure light after the separation of the sub light; and controlling a cumulative exposure light amount on said substrate based on the measurement result.

13. The exposure method according to claim 12, wherein said exposure light including said main light and said sub light is a laser light emitted from an $F_2$ laser light source.

14. A method of producing a device including a step of transferring an image of said pattern of the mask onto said substrate by using the exposure method according to claim 12.

15. An exposure method for transferring a pattern of a mask onto a substrate, including the steps of:

separating a part of an exposure light from an exposure light emitted from a light source, the exposure light including a main light having a wavelength to expose the substrate, and a sub light having a different wavelength from the wavelength of the main light, the sub light is collaterally generated in accordance with an oscillation of the main light;

separating said sub light from said part of the exposure light;

measuring energy of said exposure light after the separation of the sub light; and controlling a cumulative exposure light amount on said substrate based on the measurement result.

16. The exposure method according to claim 15, wherein said exposure light including said main light and said sub light is a laser light emitted from an $F_2$ laser light source.

17. A method of producing a device including a step of transferring an image of said pattern of the mask onto said substrate by using the exposure method according to claim 15.

18. An exposure method for transferring a pattern of a mask onto a substrate, including the steps of:

measuring first energy of an exposure light emitted from a light source, the exposure light including a main light having a wavelength to expose the substrate and a sub light having a different wavelength from the wavelength of the main light, the sub light is collaterally generated in accordance with an oscillation of the main light;

separating said main light from said exposure light including said main light and said sub light;

measuring a second energy of said exposure light after separating said main light from said exposure light; and correcting said first energy based on said second energy and controlling a cumulative exposure light amount on said substrate based on the corrected first energy.

19. The exposure method according to claim 18, wherein said exposure light including said main light and said sub light is a laser light emitted from an $F_2$ laser light source.

20. A method of producing a device including a step of transferring an image of said pattern of the mask onto said substrate by using the exposure method according to claim 18.

* * * * *